(12) United States Patent
Kim

(10) Patent No.: US 7,419,847 B2
(45) Date of Patent: Sep. 2, 2008

(54) METHOD FOR FORMING METAL INTERCONNECTION OF SEMICONDUCTOR DEVICE

(75) Inventor: Seung Hyun Kim, Suwon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 232 days.

(21) Appl. No.: 11/314,347

(22) Filed: Dec. 22, 2005

(65) Prior Publication Data

US 2006/0141663 A1    Jun. 29, 2006

(30) Foreign Application Priority Data

Dec. 29, 2004    (KR) .................. 10-2004-0114635

(51) Int. Cl.
*H01L 21/44*    (2006.01)

(52) U.S. Cl. .............. 438/98; 438/597; 438/675; 438/672; 257/E21.575; 257/E21.576; 257/E21.579; 257/E21.252

(58) Field of Classification Search ............. 438/98, 438/597, 675, 672; 257/E21.575, E21.576, 257/E21.579, E21.252
See application file for complete search history.

(56) References Cited

U.S. PATENT DOCUMENTS 6,100,195 A * 8/2000 Chan et al. ............... 438/687
6,133,144 A * 10/2000 Tsai et al. ................. 438/634
6,156,655 A * 12/2000 Huang et al. .............. 438/687
6,174,810 B1   1/2001 Islam et al.
6,316,351 B1 * 11/2001 Chen et al. ................ 438/638
6,531,386 B1 * 3/2003 Lim et al. .................. 438/631
7,223,692 B2 * 5/2007 Lin et al. ................... 438/672

FOREIGN PATENT DOCUMENTS

CN    1232291 A    10/1999

* cited by examiner

*Primary Examiner*—Michael S. Lebentritt
*Assistant Examiner*—Mohsen Ahmadi
(74) *Attorney, Agent, or Firm*—McKenna Long & Aldridge LLP

(57) ABSTRACT

A method for forming a metal interconnection of a semiconductor device avoids over-etching and under-etching through the use of the "self-stop" function of a nitridation layer, to prevent the occurrence of openings and voids in a copper interconnection and to obtain a constant trench depth. The method includes forming nitride films on a semiconductor substrate by primary annealing, the semiconductor substrate being provided with a first IMD film and a tungsten plug; depositing a second IMD film on the semiconductor substrate on which the nitride films are formed; depositing a photoresist on the second IMD film and patterning the photoresist; etching the second IMD film using the patterned photoresist to form a trench; removing the nitride films using a chemical; depositing a copper barrier metal film and a copper seed layer in the trench from which the nitride films are removed, and depositing copper; secondarily annealing the substrate on which the copper is deposited; and planarizing the secondarily annealed substrate by chemical-mechanical polishing.

14 Claims, 2 Drawing Sheets

METHOD FOR FORMING METAL INTERCONNECTION OF SEMICONDUCTOR DEVICE

This application claims the benefit of Korean Patent Application No. 10-2004-0114635, filed on Dec. 29, 2004, which is hereby incorporated by reference for all purposes as if fully set forth herein.

BACKGROUND OF THE INVENTION

1. Field of the Invention

The present invention relates to metal interconnection formation in semiconductor devices, and more particularly, to a method for forming a metal interconnection of a semiconductor device, in which, in a single damascene process using lower and upper inter-metal dielectric (IMD) films, a nitridation layer is thinly deposited and annealed before forming a trench in the upper IMD film. This obtains a constant trench depth by avoiding over-etching or under-etching when forming the trench, thereby preventing the occurrence of openings and voids in a copper interconnection.

2. Discussion of the Related Art

An electrical interconnection in a semiconductor device is formed by patterning a metal layer, which is typically made of copper to improve the operating speed of the device. To overcome etching difficulties, the metal interconnection is typically formed by a damascene process, which may be a dual damascene process or a single damascene process.

In a dual damascene process, an etch-stop layer and an IMD film are stacked and are then etched to form a via hole or a contact hole and a trench in the stacked layers. A diffusion prevention layer and a seed layer are sequentially formed on the entire surface of resulting structure, namely, on the substrate including the via hole and the trench. Here, the seed layer of a copper interconnection is a Cu seed layer, so that the diffusion prevention layer is a copper barrier metal film. The copper is deposited by electroplating and is then planarized by, for example, by chemical-mechanical polishing, to form simultaneously a via plug in the via hole and the copper interconnection in the trench.

During copper deposition, however, a lower transistor may be contaminated by diffusion of copper atoms through the contact hole. Therefore, the electrical contact in such cases is formed by a single damascene process in which a deposition of tungsten is used to first fill the via hole. Then, the copper interconnection is formed only in the trench above the contact hole. A related art method for forming a metal interconnection of a semiconductor device using a single damascene process is illustrated in FIGS. 1A and 1B.

Referring to FIGS. 1A and 1B, a contact hole is formed in a first IMD film 101 formed on a semiconductor substrate (not shown), and a tungsten plug 102 fills the contact hole. A second IMD film 103 is deposited on the first IMD film 101 to cover the filled contact hole and is then selectively etched to form a trench in which a copper barrier metal film 104 and a copper 105 are sequentially deposited.

When etching to form the trench, however, under-etching (FIG. 1A) or over-etching (FIG. 1B) may be experienced. For example, in the under-etching shown in FIG. 1A, there is an opening in the copper interconnection. In the over-etching shown in FIG. 11B, an excessive deposition of the copper barrier metal film 104 tends to occur along the upper edges of the tungsten plug 102 and thus creates an overhang 106 under which a void 107 may be generated. The openings in the copper interconnection and the voids in the copper deposition increase the resistance of the metal interconnection, thereby degrading device characteristics.

SUMMARY OF THE INVENTION

Accordingly, the present invention is directed to a method for forming a metal interconnection of a semiconductor device, which substantially obviates one or more of the problems due to limitations and disadvantages of the related art.

An advantage of the present invention is to provide a method for forming a metal interconnection of a semiconductor device in which over-etching or under-etching is avoided by the "self-stop" function of a nitridation layer, to prevent the occurrence of openings and voids in a copper interconnection.

Another advantage of the present invention is to provide a method for forming a metal interconnection of a semiconductor device, which obtains a constant trench depth.

Another advantage of the present invention is to provide a method for forming a metal interconnection of a semiconductor device, which obtains uniform resistance of the metal interconnection.

Additional features and advantages of the invention will be set forth in the description which follows, and in part will be apparent to from the description, or may be learned by practice of the invention. The objectives and other advantages of the invention will be realized and attained by the method particularly pointed out in the written description and claims hereof as well as the appended drawings.

To achieve these and other advantages and in accordance with the purpose of the invention, as embodied and broadly described, there is provided a method for forming a metal interconnection of a semiconductor device. The method comprises providing a semiconductor substrate with a first IMD film and a tungsten plug; forming nitride films on the semiconductor substrate by primary annealing; depositing a second IMD film on the semiconductor substrate on which the nitride films are formed; depositing a photoresist on the second IMD film; patterning the photoresist; etching the second IMD film using the patterned photoresist to form a trench; removing the nitride films using a chemical; depositing a copper barrier metal film and a copper seed layer in the trench from which the nitride films are removed; depositing copper; secondary annealing the substrate on which the copper is deposited; and planarizing the secondary annealed substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiment(s) of the invention and together with the description serve to explain the principles of the invention. In the drawings.

DETAILED DESCRIPTION OF THE INVENTION

Reference will now be made in detail to embodiments of the present invention, examples of which are illustrated in the accompanying drawings. Wherever possible, like reference designations will be used throughout the drawings to refer to the same or similar parts.

Figure 1A:
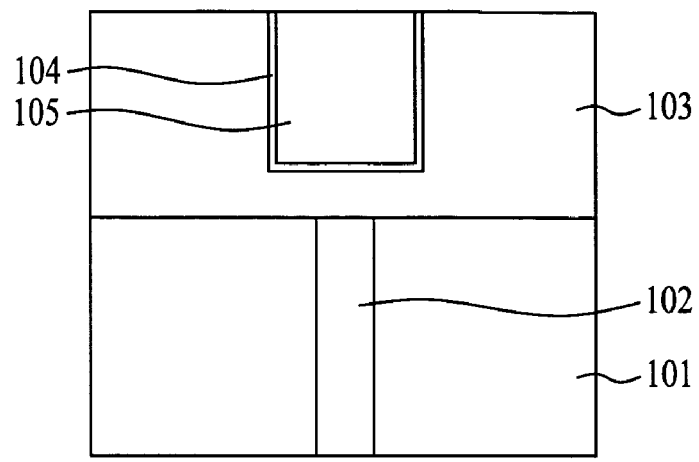
FIG. 1A is a cross-sectional view of a metal interconnection of a semiconductor device formed according to a related art method, illustrating an under-etching condition.
Figure 1B:
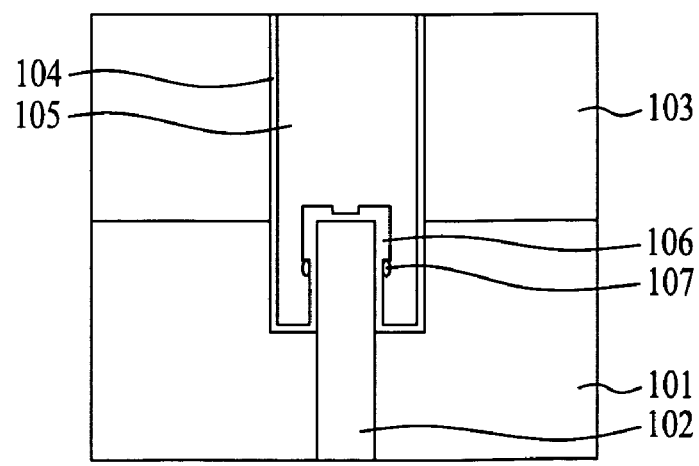
FIG. 1B is a cross-sectional view of a metal interconnection of a semiconductor device formed according to a related art method, illustrating an over-etching condition.
Figure 2A:
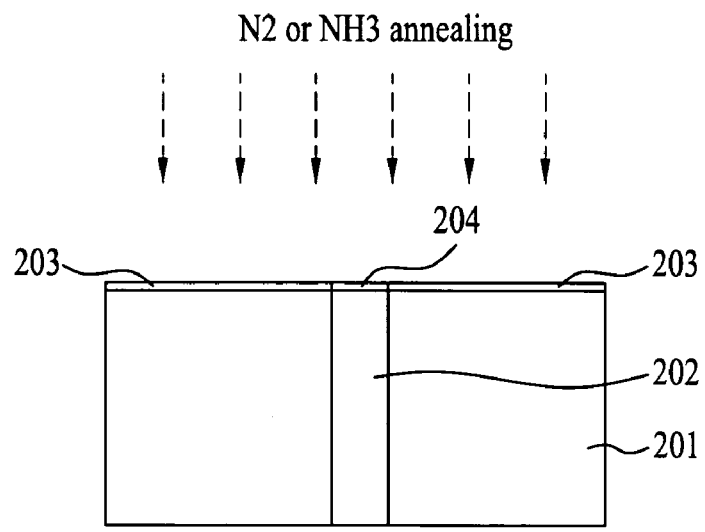
FIGS. 2A and 2B are cross-sectional views of a metal interconnection of a semiconductor device formed according to the method of the present invention.
Figure 2B:
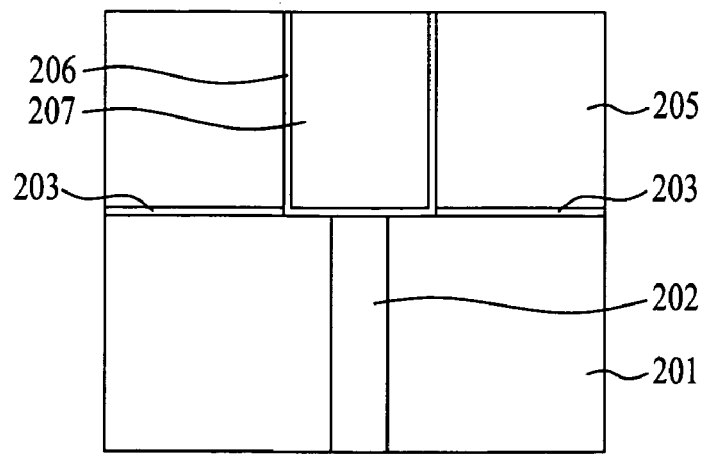

Referring to FIG. 2, illustrating a method for forming a metal interconnection of a semiconductor device according to the present invention, a contact hole is formed in a first IMD film 201 formed of silicon on a semiconductor substrate (not shown), and the contact hole is filled with a tungsten plug 202. A nitridation layer is formed on the first IMD film 201 by primary annealing under an ambient of nitrogen, thereby forming nitride films 203 and 204. Namely, a silicon nitride film 203 is formed on the surface of the first IMD film 201 and a tungsten nitride film 204 is formed on the surface of the tungsten plug 202.

During an etching of an trench, the nitride films 203 and 204 serve as a "self-stop" layer but, due to their high dielectric constants, slow the operating speed of the device. Therefore, it is preferable that the nitride films 203 and 204 are thinly formed by annealing or primary annealing to minimize their dielectric constants. In an embodiment, the primary annealing is performed at a temperature between 200° C. and 700° C. using a rapid thermal process or a furnace. Nitrogen ($N_2$), anhydrous ammonia ($NH_3$), or a material that can be nitrified with a lower layer may be used as the nitridation layer.

A second IMD film 205 is deposited on the substrate provided with the nitride films 203 and 204. A photoresist is then deposited on the second IMD film 205 and patterned for trench formation. Then, the second IMD film 205 is etched to form a trench. The etching of the trench stops at the self-stop layer, exposing a predetermined portion of the nitride films 203 and 204, which are subsequently removed using an exemplary compound of $H_2SO_4$, $H_2O_2$, and $NH_3$.

A copper barrier metal film 206 and a copper seed layer (not shown) are deposited in the trench from which the nitride films 203 and 204 have been removed. Then, a copper 207 is deposited. The metal interconnection of the semiconductor device is completed by secondary annealing and chemical-mechanical polishing.

By adopting the method for forming a metal interconnection of a semiconductor device according to the present invention, over-etching or under-etching is avoided by the self-stop function of the nitride films. This prevents the occurrence of openings and voids in the copper interconnection to obtain uniform resistance of the metal interconnection owing to the constant trench depth. In addition, since the thin nitride films are formed by annealing, the dielectric constant of the nitride films can be minimized.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for forming a metal interconnection of a semiconductor device, comprising:

providing a semiconductor substrate with a first IMD film and a tungsten plug;

forming a silicon nitride film and a tungsten nitride film on the first IMD and the tungsten plug by primary annealing;

depositing a second IMD film on the nitride films;

depositing a photoresist on the second IMD film;

patterning the photoresist to form a trench;

etching the second IMD film using the patterned photoresist;

removing a portion of the nitride films in the trench; and removing the photoresist.

2. The method of claim 1, further comprising:

depositing a copper barrier metal film and a copper seed layer in the trench from which the nitride films are removed;

depositing copper;

secondary annealing the substrate on which the copper is deposited; and planarizing the secondary annealed substrate.

3. The method of claim 1, wherein the first IMD film is made of silicon.

4. The method of claim 1, wherein the silicon nitride film is formed on the first IMD film and the tungsten nitride film is formed on the tungsten plug by said primary annealing.

5. The method of claim 1, wherein the nitride films are formed using any one of $N_2$, $NH_3$, and a material that can be nitrified with a lower layer.

6. The method of claim 1, wherein the primary annealing process is performed at a temperature between about 200° C. and about 700° C. using one of a rapid thermal process and a furnace.

7. The method of claim 1, wherein the portion of the nitride films is removed using a chemical compound of $H_2SO_4$, $H_2O_2$, and $NH_3$.

8. The method of claim 2, wherein planarizing the secondary annealed substrate is performed by chemical-mechanical polishing.

9. The method of claim 1, wherein the etching the second IMD film is performed by dry etching.

10. The method of claim 1, wherein removing the portion of the nitride films is performed by wet etching.

11. The method of claim 9, wherein the nitride films are an etch stop for the dry etching.

12. The claim method of claim 10, wherein the first IMD film and the tungsten plug are etch stops for the wet etching.

13. A semiconductor device, comprising:

a first IMD layer;

a tungsten plug in the first IMD layer;

a silicon nitride layer on the first IMD layer and a tungsten nitride film on the tungsten plug;

a second IMD layer on the silicon and tungsten nitride layers;

a trench in the second IMD layer and on a portion of the nitride layers;

a barrier metal layer in the trench; and a copper plug in the trench on the barrier metal layer.

14. The semiconductor device of claim 13, wherein a bottom of the trench is on the tungsten plug and the first IMD layer.

* * * * *